(12) United States Patent
Verma et al.

(10) Patent No.: US 12,340,099 B2
(45) Date of Patent: *Jun. 24, 2025

(54) STATIC RANDOM ACCESS MEMORY SUPPORTING A SINGLE CLOCK CYCLE READ-MODIFY-WRITE OPERATION WITH A MODULATED WORD LINE ASSERTION

(71) Applicant: STMicroelectronics International N.V., Geneva (CH)

(72) Inventors: Praveen Kumar Verma, Greater Noida (IN); Harsh Rawat, Faridabad (IN)

(73) Assignee: STMicroelectronics International N.V., Geneva (CH)

( * ) Notice: Subject to any disclaimer, the term of this patent is extended or adjusted under 35 U.S.C. 154(b) by 146 days.

This patent is subject to a terminal disclaimer.

(21) Appl. No.: 18/196,152

(22) Filed: May 11, 2023

(65) Prior Publication Data
US 2023/0280915 A1 Sep. 7, 2023

Related U.S. Application Data

(63) Continuation-in-part of application No. 17/861,384, filed on Jul. 11, 2022, now Pat. No. 12,040,013.

(60) Provisional application No. 63/231,851, filed on Aug. 11, 2021.

(51) Int. Cl.
*G06F 3/06* (2006.01)
(52) U.S. Cl.
CPC .......... *G06F 3/0625* (2013.01); *G06F 3/0659* (2013.01); *G06F 3/0673* (2013.01)
(58) Field of Classification Search
CPC .... G06F 3/0625; G06F 3/0659; G06F 3/0673; G11C 7/1006; G11C 11/419

USPC .......................................................... 711/154
See application file for complete search history.

(56) References Cited

U.S. PATENT DOCUMENTS

| | | |
|---|---|---|
| 5,367,653 A | 11/1994 | Coyle et al. |
| 5,752,260 A | 5/1998 | Liu |
| 6,112,295 A | 8/2000 | Bhamidipati et al. |
| 6,608,772 B2 | 8/2003 | Doishi |
| 6,707,752 B2 | 3/2004 | Zhang |
| 6,751,143 B2 | 6/2004 | Morgan et al. |
| 6,751,159 B2 | 6/2004 | Farrell et al. |
| 7,038,949 B2 | 5/2006 | Chae et al. |
| 7,088,638 B1 | 8/2006 | Bunce et al. |
| 7,251,186 B1 | 7/2007 | Kengeri et al. |

(Continued)

OTHER PUBLICATIONS

Selvan, Vinoth: "Adaptive Cache Power Management Strategies", a Thesis Submitted to the Faculty of the Graduate School of the University of Minnesota, Jun. 2016, 51 pages.

*Primary Examiner* — Huan Hoang
(74) *Attorney, Agent, or Firm* — Crowe & Dunlevy LLC (57) ABSTRACT

A read-modify-write operation is performed, within a single cycle of a clock signal, by: decoding an address to select a word line of a memory; applying a word line signal at a first voltage level to the selected word line; reading a current data word from a data word location in the memory; reducing the word line signal from the first voltage level to the second voltage level; performing a mathematical modify operation internally within the memory on the current data word to generate a modified data word; increasing the word line signal from the second voltage level to the first voltage level; and writing the modified data word back to the location in the memory.

21 Claims, 8 Drawing Sheets

(56) References Cited

U.S. PATENT DOCUMENTS

| | | |
|---|---|---|
| 7,339,850 B2 | 3/2008 | Morishima |
| 7,420,867 B2 | 9/2008 | Broz |
| 7,469,369 B2 | 12/2008 | Matsuoka et al. |
| 7,684,257 B1 | 3/2010 | Lee et al. |
| 7,848,129 B1 | 12/2010 | Deshpande et al. |
| 8,000,156 B2 | 8/2011 | Van Winkelhoff et al. |
| 8,850,137 B2 | 9/2014 | Nazar et al. |
| 8,902,672 B2 | 12/2014 | Iyer et al. |
| 9,361,955 B2 | 6/2016 | Muralimanohar et al. |
| 9,411,391 B2 | 8/2016 | Bhatia et al. |
| 9,460,016 B2 | 10/2016 | Redford et al. |
| 9,971,541 B2 | 5/2018 | Lea et al. |
| 10,048,888 B2 | 8/2018 | Willcock et al. |
| 10,268,389 B2 | 4/2019 | Lea |
| 10,402,110 B2 | 9/2019 | Ware et al. |
| 10,460,781 B2 | 10/2019 | Berger et al. |
| 10,522,210 B2 | 12/2019 | Hush et al. |
| 10,740,188 B2 | 8/2020 | Park |
| 10,867,681 B2 | 12/2020 | Clinton et al. |
| 10,991,423 B2 | 4/2021 | Singh et al. |
| 11,705,176 B2 | 7/2023 | Endoh et al. |
| 12,040,013 B2 * | 7/2024 | Verma .................... G11C 7/227 |
| 2001/0024382 A1 | 9/2001 | Shimoyama et al. |
| 2008/0183984 A1 | 7/2008 | Beucler et al. |
| 2013/0308364 A1 | 11/2013 | Smith |
| 2015/0109865 A1 | 4/2015 | Gulati et al. |
| 2016/0329088 A1 | 11/2016 | You |
| 2018/0046436 A1 | 2/2018 | Lu |
| 2020/0143901 A1 | 5/2020 | Chhabra et al. |
| 2020/0258890 A1 | 8/2020 | Augustine et al. |
| 2021/0117156 A1 | 4/2021 | Ali et al. |
| 2021/0142863 A1 | 5/2021 | Nazar et al. |
| 2021/0391001 A1 | 12/2021 | Park et al. |
| 2023/0050783 A1 | 2/2023 | Verma et al. |
| 2023/0051672 A1 | 2/2023 | Rawat et al. |
| 2023/0135708 A1 | 5/2023 | Verma |
| 2023/0393766 A1 | 12/2023 | Bedeschi |

* cited by examiner

STATIC RANDOM ACCESS MEMORY SUPPORTING A SINGLE CLOCK CYCLE READ-MODIFY-WRITE OPERATION WITH A MODULATED WORD LINE ASSERTION

CROSS REFERENCE TO RELATED APPLICATIONS

This application in a continuation-in-part of U.S. patent application Ser. No. 17/861,384, filed Jul. 11, 2022, which claims priority from United States Provisional Application for Pat. No. 63/231,851, filed Aug. 11, 2021, the disclosures of which are incorporated by reference.

TECHNICAL FIELD

The present invention generally relates to a static random access memory (SRAM) circuit and, in particular, to an SRAM circuit configured to perform a read-modify-write operation in a single clock cycle.

BACKGROUND

Figure 1:
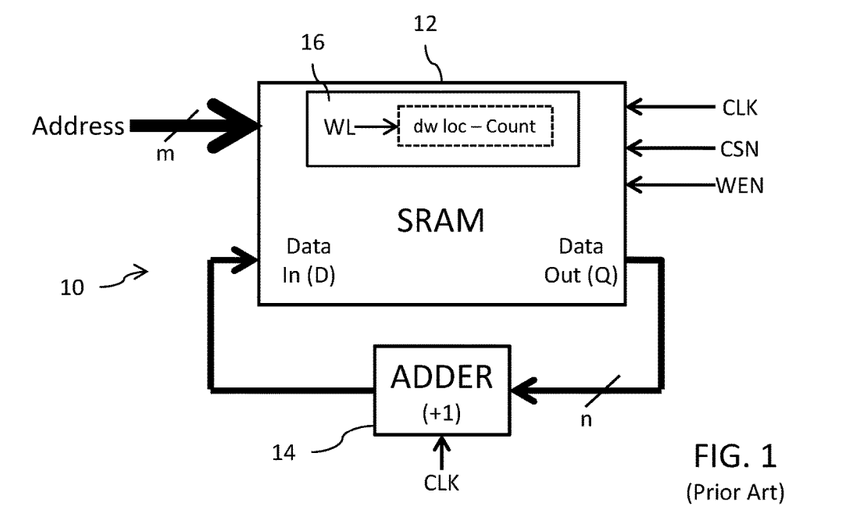
FIG. 1 shows is a block diagram of a circuit configured to perform a read-modify-write operation with respect to a count value stored in a static random access memory (SRAM) using an external modify circuit.

Reference is made to FIG. 1 which shows a block diagram of a circuit 10 including a static random access memory (SRAM) 12 that is configured to store data. In a particular application, the stored data is histogram data where each data word location (dw loc) in the memory array 16 of the SRAM 12 stores a count value (Count). As part of the operation of the circuit 10 for building a histogram, the count value is modified in some way (for example, incremented by one) each time the data word location is accessed. This operation typically involves three steps: step 1) reading the n-bit current count value from a particular data word location accessed in response to an m-bit memory address (Address); step 2) mathematically modifying the current count value (for example, incrementing by one); and step 3) writing the modified count value back to the SRAM 12 at the accessed data word location. The step 2) operation for mathematically modifying the count value is performed here by a data modification circuit 14 that is external to (and separate from) the SRAM 12. The data modification circuit 14 is coupled to the data output (Q) port and data input (D) port of the SRAM 12 through one or more n-bit data bus circuits. As an example, the data modification circuit 14 may comprise an n-bit adder circuit that operates on the current count value read from the memory at the data output (Q) to increment by one and output the modified count value to be written back to the memory at the data input (D).

Figure 2:
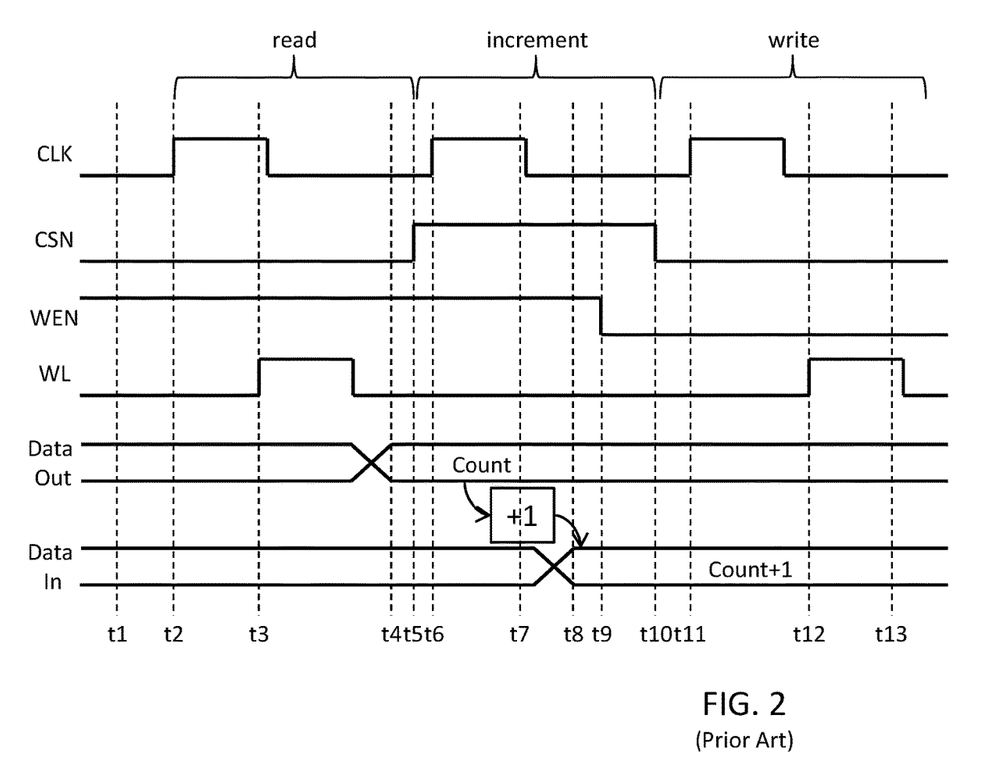
FIG. 2 shows a timing diagram for operation of the circuit of FIG. 1.

Reference is now made to FIG. 2 which shows a timing diagram for the operation of the circuit 10. At time t1, the chip select signal (CSN) is asserted logic low to select the SRAM 12 and the write enable signal (WEN) is deasserted logic high to place the SRAM 12 in data read mode. At time t2, the memory address (Address) is applied and the clock signal CLK pulses a first time to initiate a read operation. The Address is decoded by the SRAM 12 and the word line (WL) coupled to the data word location (dw loc) corresponding to the decoded Address is asserted logic high at time t3. The count value (Count) is then read (step 1) from the addressed data word location in the array 16 and output at time t4 through the data output (Q) port of the SRAM 12. The chip select signal (CSN) is then deasserted logic high at time t5 to deselect the SRAM 12 so that the SRAM 12 does not perform an operation in response to the next pulse of the clock signal CLK. At time t6, the clock signal CLK pulses a second time to cause the data modification circuit 14 to perform the mathematical modify operation (step 2) at time t7, which in this example case is an increment by one (+1) operation. The modified count value (Count+1) is then applied by the data modification circuit 14 to the data input (D) port of the SRAM 12 at time t8. At time t9, the write enable signal (WEN) is asserted logic low to place the SRAM 12 in write mode. The chip select signal (CSN) is then asserted logic low at time t10 to select the SRAM 12. At time t11, the memory address (Address) is applied (e.g., remains applied from the read) and the clock signal CLK pulses a third time to initiate a data write operation. The Address is decoded by the SRAM 12 and the word line (WL) coupled to the data word location (dw loc) is asserted logic high at time t12. The modified count value (Count+1) is then written (step 3) from the data input port of the SRAM 12 at time t13 to the addressed data word location.

There are a number of concerns with the circuit 10 of FIG. 1 and its operation as detailed in FIG. 2. The circuit operation is multi-cycle in that it requires three clock cycles and two separate word line assertions to complete. Because of this multi-cycle operation, there is significantly high power consumption in the circuit 10 due to data signal toggling. The power consumption concern is further magnified by the fact that the mathematical modify part of the operation (step 2) occurs external to the SRAM 12 and thus there is toggling of data for the data signals at both the data output (Q) port and data input (D) port.

Figure 3:
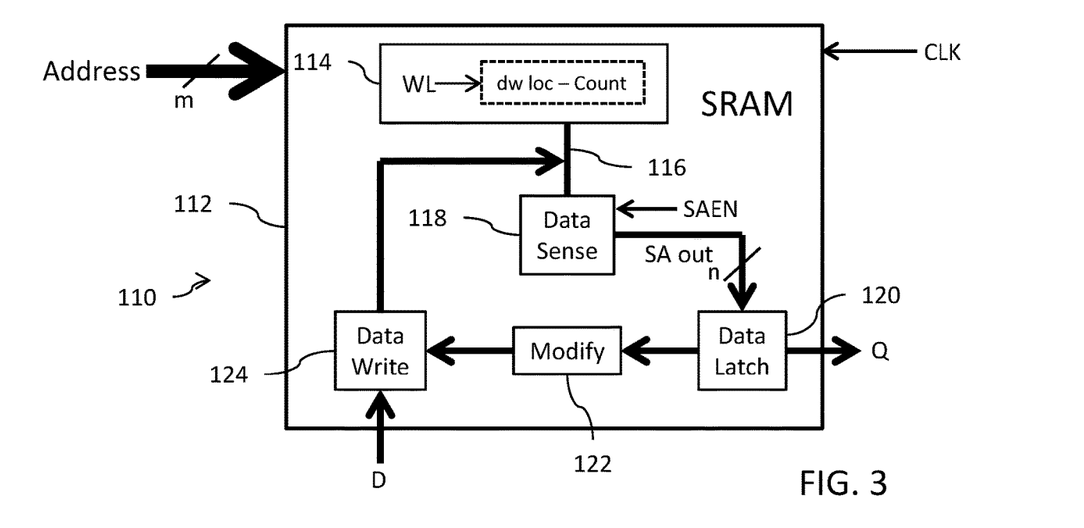
FIG. 3 shows is a block diagram of a circuit configured to perform a read-modify-write operation with respect to a count value stored in a static random access memory (SRAM) using an internal modify circuit.

Reference is made to FIG. 3 which shows a block diagram of a circuit 110 including a static random access memory (SRAM) 112 that is configured to store data. In a particular application, the stored data is histogram data where each data word location (dw loc) in the SRAM 112 stores a count value (Count). As part of the operation of the circuit 110 for building a histogram, the count value is modified in some way (for example, incremented by one) each time the data word location is accessed. This operation typically involves three steps: step 1) reading the n-bit current count value from a particular data word location accessed in response to an m-bit memory address (Address); step 2) mathematically modifying the current count value (for example, incrementing by one); and step 3) writing the modified count value back to the particular data word location in the SRAM 112. The step 2) operation for mathematically modifying the count value is advantageously performed internally within the SRAM 112. Because of this, there is no need to toggle data signals at the data output (Q) port and data input (D) port of the SRAM 112, and there is no external data calculation operation performed, and thus there is a reduction in power consumption in comparison to the solution shown in FIG. 1. Still further, by performing the mathematical modify operation internally for step 2) of the read-modify-write operation, there is no implication of external circuitry and the overall operation can be performed by the SRAM itself in a single clock cycle.

The SRAM 112 is clocked by a clock signal CLK and includes a memory array 114 comprising a plurality of n-bit accessible data word locations (dw loc). In response to an applied m-bit memory address (Address) and a single pulsing of the clock signal CLK, a word line WL is asserted to select and access one of the data word locations in the memory array 114. The bit lines 116 of the memory array 114 are coupled to a data sensing circuit 118. The data sensing circuit 114 is formed by a plurality of sense amplifiers (one sense amplifier per data bit of the n-bit data word at the accessed data word location). The data sensing circuit 118 is enabled to perform the data sensing operation on the bit lines 116 in response to assertion of a sense amplifier enable (SAEN) signal in order to read the data word (i.e., the count value (Count)) from the accessed data word location in the memory array 114. As discussed in greater detail below, the timing of assertion of the SAEN signal can be controlled following the leading edge of the clock signal CLK based on a dummy read operation performed by the SRAM 112. This ensures that the sense amplifiers are not enabled to drive voltages on the sense amplifier output (SA out) lines until it is clear that the data bits are available on the bit lines in response to assertion of the word line signal. A data latch circuit 120 then latches the read data word (here, the count value) from the SA out lines. A data modification circuit 122 that is internal to the SRAM 112 performs a data modification on the latched data word. As an example, the data modification circuit 122 may comprise an n-bit adder circuit that operates on the latched data word (which is the current count value stored in the memory) to increment by one and output the modified data word (i.e., Count+1). As discussed in greater detail herein, the timing of completion of the data modification operation can be detected by the SRAM 112 for the purpose of controlling when to begin the write phase. This ensures that the data to be written back to the memory is an accurate modification at the output of the modify circuit 122. A data write circuit 124 then writes the data bits of the modified data word back to the bit lines 116 to be stored at the accessed data word location in the memory array 114. It will be noted that because of read multiplexing circuitry, not explicitly shown, the data sensing circuit 118 at this point in time has been disconnected from the bit lines and the SAEN signal is no longer asserted. Following completion of the data write, the word line signal is deasserted. As discussed in greater detail herein, the timing of completion of the write operation can be controlled based on a dummy write operation performed by the SRAM 112. This ensures that the data bits of the modified data word remain on the bit lines 116 for a sufficient amount of time to ensure successful write back into the memory cells M.

Figure 4:
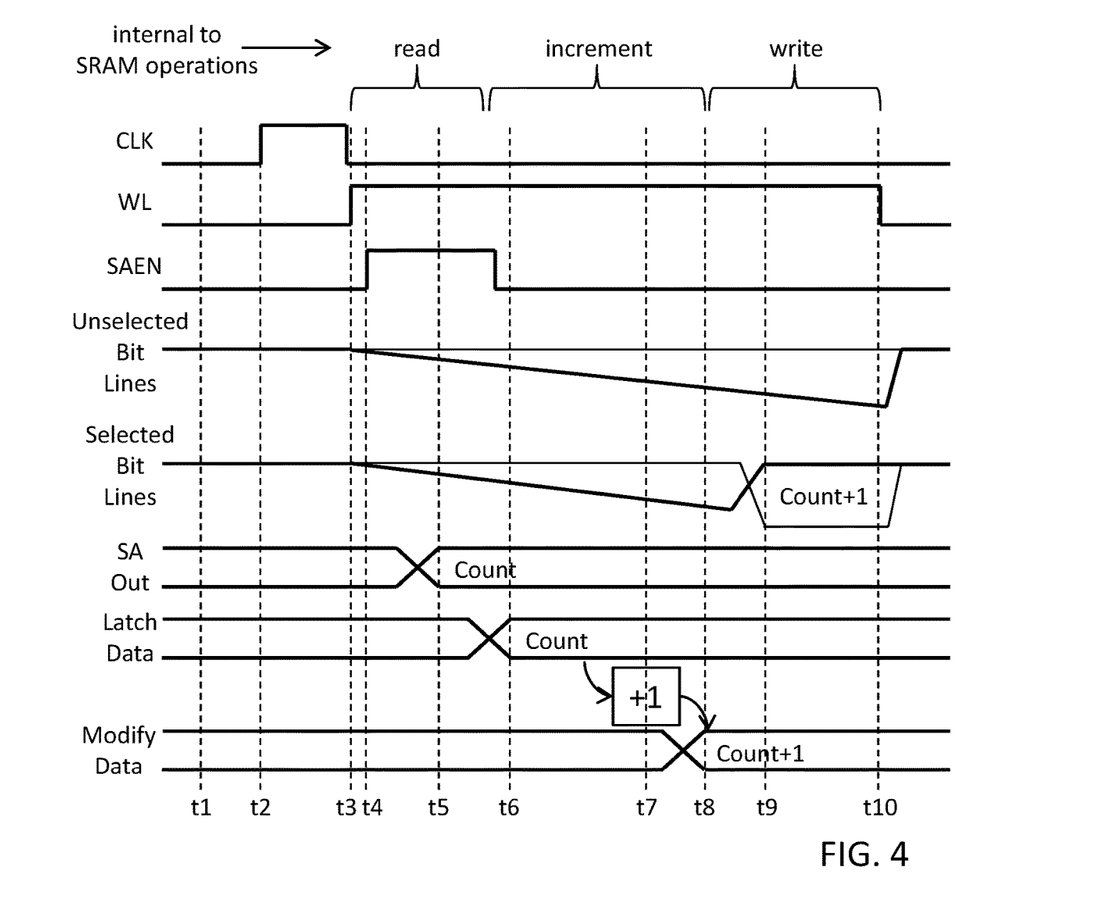
FIG. 4 shows a timing diagram for operation of the circuit of FIG. 3.

Reference is now made to FIG. 4 which shows a timing diagram for operation of the circuit 110. At time t1, the SRAM 112 is enabled for operation and the bit lines 116 are precharged to a precharge voltage level (shown here, by example only, at Vdd). At time t2, the memory address (Address) is applied and the clock signal CLK pulses. The Address is decoded by the SRAM 112 and the word line (WL) coupled to the data word location (dw loc) corresponding to the decoded Address is asserted logic high at time t3. In response to the asserted word line signal and the logic state of the stored data, the voltage on the bit lines begins to discharge from the precharge voltage level Vdd. At time t4, the sense amplifier enable (SAEN) signal is asserted logic high to enable operation of the sense amplifiers within the data sensing circuit 118. The sense amplifiers respond at time t5 to sense the voltage on the bit lines 116 and drive corresponding output signals (SA out) from the data sensing circuit 118 to logic high or logic low levels dependent on the logic state of the bits of the data word stored in the accessed data word location and presented on the bit lines. Thus, the data word has been read (step 1) from the memory array 114 and the output of the data sensing circuit 118 now reflects the count value (Count). The data latch circuit 120 latches the read data word from the output of the data sensing circuit 118 at time t6, and thus the latched data also reflects the count value (Count). The data modification circuit 122 then performs the mathematical modify operation (step 2) at time t7, which in this example case is an increment by one (+1) operation, and the output modified data from the data modification circuit 122 at time t8 reflects the incremented count value (Count+1). The data write circuit 124 then applies the data bits of the modified data word back to the bit lines 116 (noting here that the voltage of the bit line(s) has continued from time t4 to slowly discharge in response to the continued assertion of the word line signal). Because the signal on the word line (WL) remains asserted logic high, the modified data word is then written (step 3) at time t9 for storage at the accessed data word location in the memory array 114. Following completion of the data write operation at time t10, a reset is performed where the word line (WL) is deasserted logic low and the bit lines of the memory are returned to the precharge voltage level.

It the context of the solution of FIGS. 3-4, it is noted that a significant percentage (for example, about 40%) of the total power consumed for the single clock cycle read-modify-write operation is consumed in connection with the operation of the bit lines. This includes the power consumed during the read phase due to bit line discharge (as to both unselected bit lines, meaning those bit lines that are not column decode multiplex selected, and selected bit lines, meaning those bit lines that are column decode multiplex selected), and the power consumed during the write phase due to driving the bit lines, and the power consumed during reset after completion of the write phase to return the discharged (selected and unselected) bit lines to their precharge voltage levels.

There is accordingly a need in the art to address the power consumption concerns and provide a more efficient implementation of the read-modify-write operation.

SUMMARY

In an embodiment, a circuit clocked by a clock signal comprises: a memory array including memory cells forming a data word location accessed in response to a modulated word line signal; a plurality of bit lines associated with said memory cells; a data sensing circuit configured when the modulated word line signal has a first voltage level to sense data on said plurality of bit lines, said sensed data corresponding to a current data word stored at the data word location; a data latching circuit configured to latch the sensed data for said current data word from the data sensing circuit; a data modification circuit configured when the modulated word line signal has a second voltage level lower than the first voltage level to perform an internal memory mathematical modify operation on the current data word to generate a modified data word; and a data writing circuit configured when the modulated word line signal has the first voltage level to apply data for the modified data word to the plurality of bit lines for writing back to the memory cells of the memory array at said data word location; wherein the sensing of the data on said plurality of bit lines, the latching of the sensed data, the performing of the internal memory mathematical modify operation and the writing back of the modified data word all occur within a single cycle of the clock signal.

In an embodiment, a method for performing a read-modify-write operation, within a single cycle of a clock signal, comprises: decoding an address to select a word line of a memory; applying a word line signal at a first voltage level to the selected word line; reading a current data word from a data word location in the memory; reducing the word line signal from the first voltage level to the second voltage level; performing a mathematical modify operation internally within the memory on the current data word to generate a modified data word; increasing the word line signal from the second voltage level to the first voltage level; and writing the modified data word back to the location in the memory.

BRIEF DESCRIPTION OF THE DRAWINGS

For a better understanding of the embodiments, reference will now be made by way of example only to the accompanying figures in which.

DETAILED DESCRIPTION

Figure 5A:
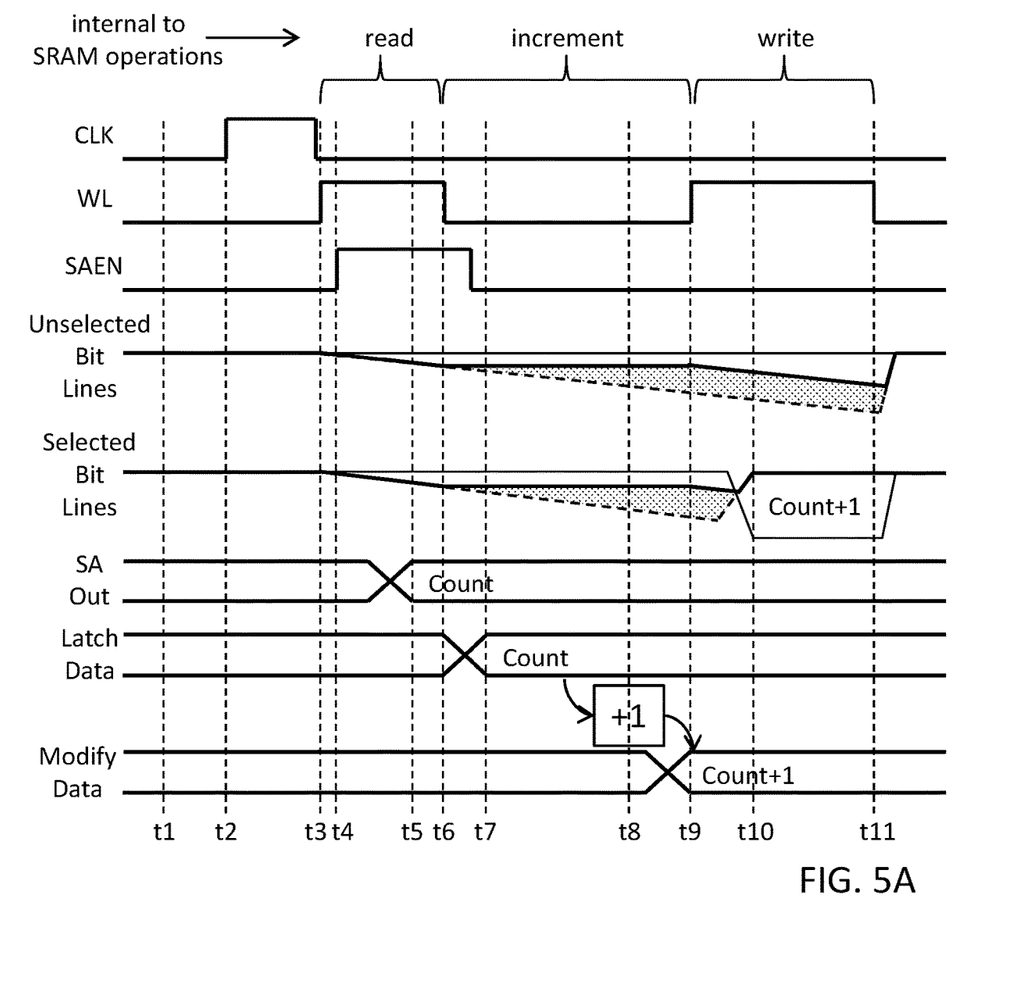
FIG. 5A shows a timing diagram for an embodiment for improved operation of the circuit of FIG. 3.

Reference is now made to FIG. 5A which shows a timing diagram for an embodiment presenting an improved operation of the circuit 110. At time t1, the SRAM 112 is enabled for operation and the bit lines 116 are precharged to a precharge voltage level (shown here, by example only, at Vdd). At time t2, the memory address (Address) is applied and the clock signal CLK pulses. The Address is decoded by the SRAM 112 and the word line (WL) coupled to the data word location (dw loc) corresponding to the decoded Address is asserted logic high at time t3. In response to the asserted word line signal and the logic state of the stored data, the voltage on the bit lines (selected and unselected) begins to discharge from Vdd. At time t4, the sense amplifier enable (SAEN) signal is asserted logic high to enable operation of the sense amplifiers within the data sensing circuit 118. The sense amplifiers respond at time t5 to sense the voltage on the bit lines 116 and drive corresponding output signals (SA out) from the data sensing circuit 118 to logic high or logic low levels dependent on the logic state of the bits of the data word stored in the accessed data word location. Thus, the data word has been read (step 1) from the memory array 114 and the output of the data sensing circuit 118 now reflects the count value (Count). At the completion of the read operation at time t6, the word line is deasserted to logic low in accordance with a single clock cycle word line modulation scheme. This deassertion of the word line terminates continued discharge of the bit lines. The data latch circuit 120 latches the read data word from the output of the data sensing circuit 118 at time t7, and thus the latched data also reflects the count value (Count). The data modification circuit 122 then performs the mathematical modify operation (step 2) at time t8, which in this example case is an increment by one (+1) operation, and the output modified data from the data modification circuit 122 at time t9 reflects the incremented count value (Count+1). At the start of the write (step 3) at time t9, the word line (WL) coupled to the data word location (dw loc) corresponding to the decoded Address is again asserted logic high in accordance with the single clock cycle word line modulation scheme. The data write circuit 124 then applies the data bits of the modified data word back to the bit lines 116 (noting here that the voltage of the bit lines will once again begin to slowly discharge in response to the assertion of the word line signal). The modified data word is then written at time t10 for storage at the accessed data word location in the memory array 114. Following completion of the data write operation at time t11, a reset is performed in response to which the word line (WL) is deasserted logic low and the bit lines are returned to their precharge voltage levels.

Figure 5B:
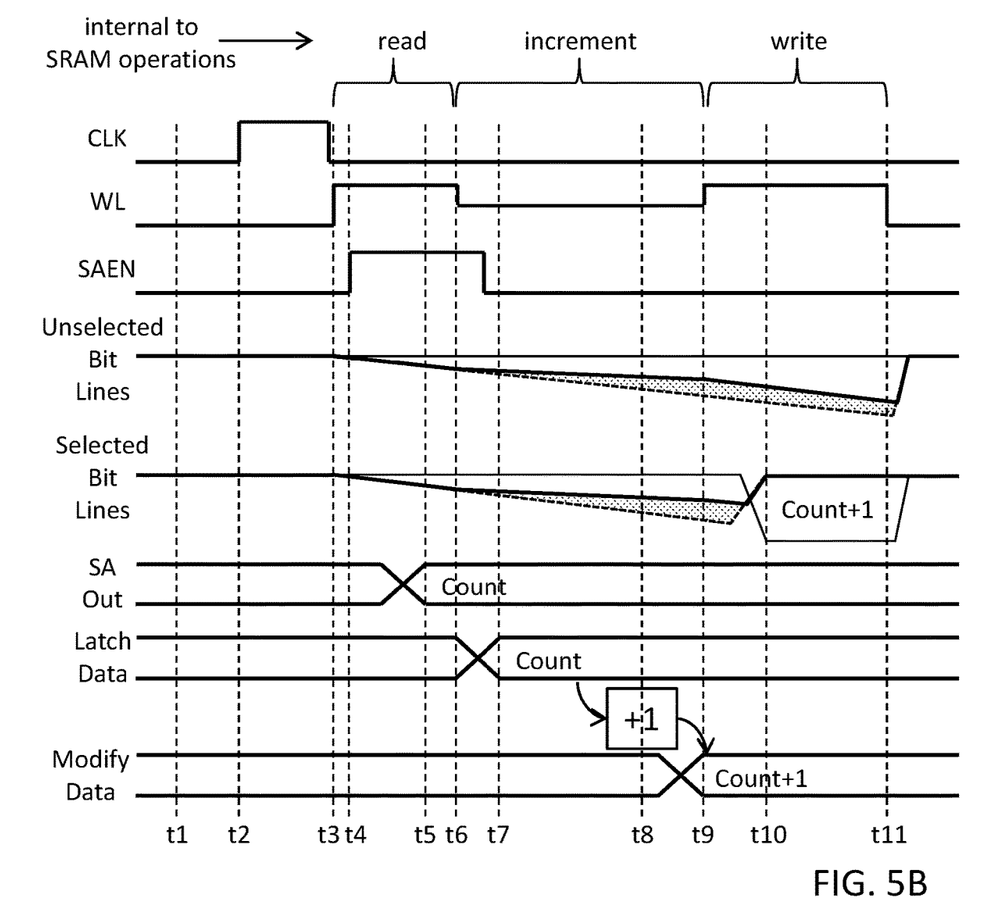
FIG. 5B shows a timing diagram for another embodiment for improved operation of the circuit of FIG. 3.

Reference is now made to FIG. 5B which shows a timing diagram for an alternative embodiment presenting an improved operation of the circuit 110. At time t1, the SRAM 112 is enabled for operation and the bit lines 116 are precharged to a precharge voltage level (shown here, by example only, at Vdd). At time t2, the memory address (Address) is applied and the clock signal CLK pulses. The Address is decoded by the SRAM 112 and the word line (WL) coupled to the data word location (dw loc) corresponding to the decoded Address is asserted logic high at time t3. In response to the asserted word line signal and the logic state of the stored data, the voltage on the bit lines begins to discharge from Vdd. At time t4, the sense amplifier enable (SAEN) signal is asserted logic high to enable operation of the sense amplifiers within the data sensing circuit 118. The sense amplifiers respond at time t5 to sense the voltage on the bit lines 116 and drive corresponding output signals (SA out) from the data sensing circuit 118 to logic high or logic low levels dependent on the logic state of the bits of the data word stored in the accessed data word location. Thus, the data word has been read (step 1) from the memory array 114 and the output of the data sensing circuit 118 now reflects the count value (Count). At the completion of the read operation at time t6, the voltage level of the asserted word line is lowered to an underdrive voltage level (for example, Vdd/2) in accordance with a single clock cycle word line modulation scheme. This underdrive of the word line reduces the slope of the continued discharge of the bit lines. The data latch circuit 120 latches the read data word from the output of the data sensing circuit 118 at time t7, and thus the latched data also reflects the count value (Count). The data modification circuit 122 then performs the mathematical modify operation (step 2) at time t8, which in this example case is an increment by one (+1) operation, and the output modified data from the data modification circuit 122 at time t9 reflects the incremented count value (Count+1). At the start of the write (step 3) at time t9, the word line (WL) coupled to the data word location (dw loc) corresponding to the decoded Address is again asserted logic high (i.e., word line underdrive is terminated) in accordance with the single clock cycle word line modulation scheme. The data write circuit 124 then applies the data bits of the modified data word back to the bit lines 116 (noting here that the voltage of the bit line(s) will continue to discharge with a higher slope in response to the full Vdd voltage of the asserted word line signal). The modified data word is then written at time t10 for storage at the accessed data word location in the memory array 114. Following completion of the data write operation at time t11, a reset is performed and the word line (WL) is deasserted logic low.

FIGS. 5A and 5B also show, with dotted lines, for comparison purposes, the voltage levels of the unselected and selected bit lines corresponding to the operation shown in FIG. 4 where the word line modulation scheme is not practiced. The shaded regions in FIGS. 5A and 5B illustrate the difference (i.e., reduction) in power consumption that is achieved by use of the modulated word line scheme during a single clock cycle read-modify-write operation. In this context, the word line modulation is a selective turning off (deassert to logic 0) of the selected word line during the increment (step 2) time period as shown in FIG. 5A or a selective underdrive (drive to Vdd/2 level) of the selected word line during the increment (step 2) time period as shown in FIG. 5B.

Figure 6:
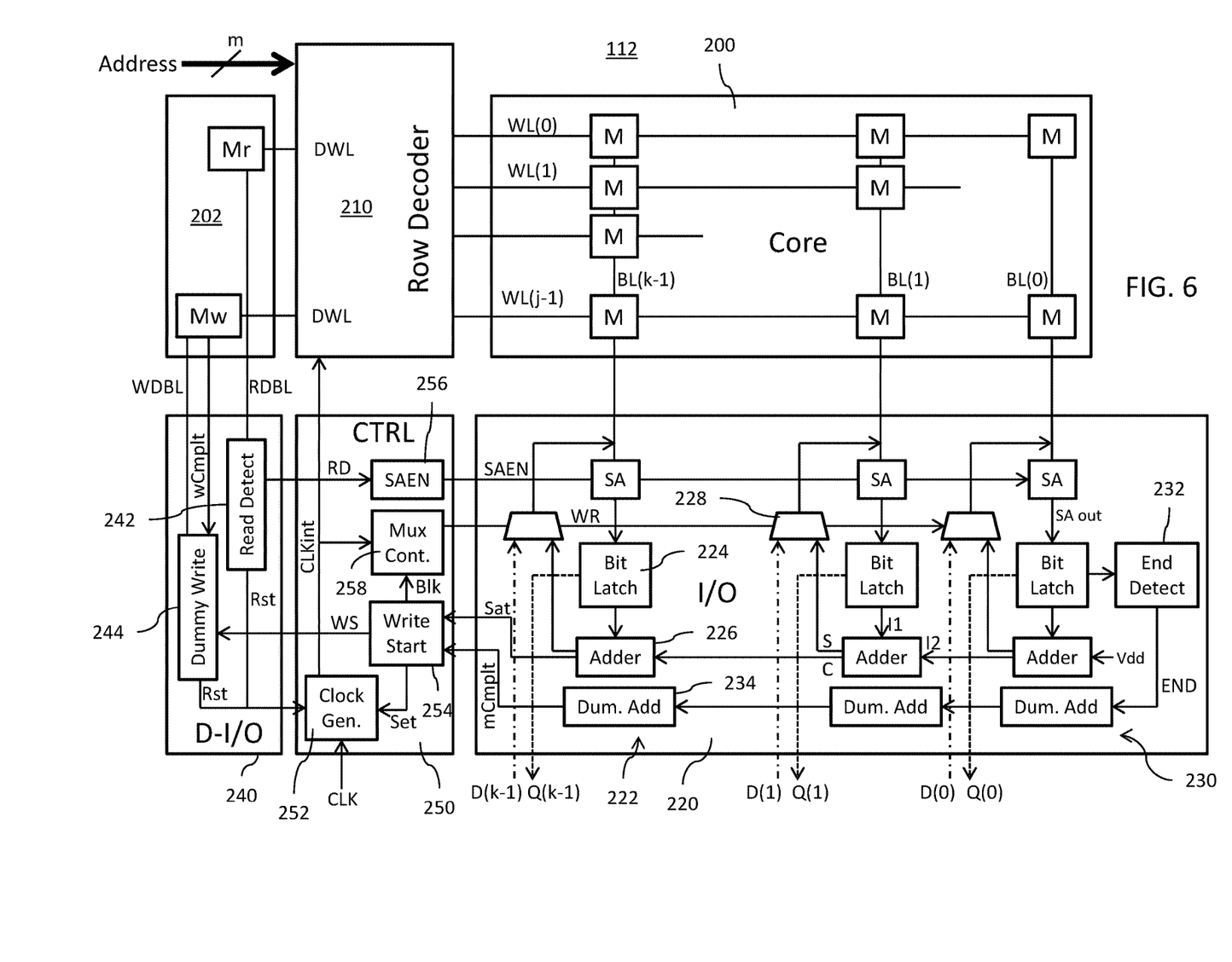
FIG. 6 shows a detailed block diagram of an SRAM for the circuit of FIG. 3.

Reference is now made to FIG. 6 which shows a detailed block diagram of the SRAM 112 for the circuit 110 of FIG. 3. The memory array 114 includes a memory core 200 and a dummy memory area 202. The memory core 200 and dummy memory area 202 each include a plurality of SRAM cells (M) (for example, of the 6T or 8T type as is well known in the art).

In the memory core 200, the cells M are arranged in an array including j rows and k columns. The cells M in each row of the memory core 200 are coupled to a corresponding word line (WL), and the cells in each column are coupled to at least one corresponding bit line (BL). In an implementation using the 6T type SRAM circuit, a pair of complementary bit lines are present and are used in connection with both writing data to and reading data from the memory cell of a column. In an implementation using the 8T type SRAM circuit, a pair of complementary write bit lines and a single read bit line are present, with the write bit lines used in connection with writing data to the memory cell and the read bit line used in connection with reading data from the memory cell. The j memory cells M of each row at a given memory address location form a bin which stores a data word corresponding to a count value (Count) of the histogram. In the illustrated implementation, the bit stored in the memory cell of column 0 is the least significant bit (LSB) of the count value and the bit stored in the memory cell of column k-1 is the most significant bit (MSB) of the count value. While this illustration shows an implementation of the memory with a column MUX=1 (where there would be no unselected bit lines during read), those skilled in the art will be able to expand this architecture to column MUX>1 design (where there will be both selected and unselected bit lines during read).

The dummy memory area 202 includes a dummy read cell Mr and a dummy write cell Mw. The dummy cells Mr and Mw are, like the cells M of the memory core 200, implemented using either a 6T or 8T type SRAM circuit. The dummy read cell Mr is programmed with a fixed logic state (for example, logic low). The dummy cells Mr and Mw are both actuated in response to assertion of a signal on a dummy word line (DWL) for the dummy memory area 202. The dummy read cell Mr is coupled to a read dummy bit line (RDBL), and the dummy write cell Mw is coupled to a write dummy bit line (WDBL). In an implementation using the 6T type SRAM circuit, the bit line comprises a pair of complementary dummy bit lines. In an implementation using the 8T type SRAM circuit, the bit line comprises a pair of complementary dummy write bit lines and a single dummy read bit line. The dummy write cell Mw further includes circuitry configured to sense the write operation and generate a write complete signal (wCmplt) in response to successful completion of a data write into the dummy write cell Mw.

The SRAM 112 further includes a row decoder circuit 210 that is configured to receive the memory address (Address) and an internal clock signal CLKint. The row decoder circuit 210 responds thereto by decoding the receive memory address and selectively actuating one word line (WL) which corresponds to the decoded memory address in the memory core 200 and further actuating the dummy word line (DWL) for the dummy memory area 202. Details of the circuitry for the row decoder circuit 210 are not provided as such circuitry is well known to those skilled in the art. Note also that because this is a column MUX=1 implementation, there is no provision made here for a column decoder circuit.

The data input/output (I/O) circuitry 220 for the SRAM 112 includes an I/O circuit 222 for each column of the memory core 200. Each I/O circuit 222 includes a sense amplifier SA circuit connected to the bit line BL of the corresponding column. The sense amplifier SA circuit functions, in response to assertion of a sense amplifier enable SAEN signal, to drive an output signal (SA out) to a supply rail (Vdd or ground, for example) as a function of the logic state of the data bit stored in the memory cell M of the row which is selected by the actuation of the word line WL. The plurality of sense amplifier SA circuits in the data input/output (I/O) circuitry 220 form the data sensing circuit 118 (see, FIG. 3). The logic state of the data bit output by the sense amplifier SA circuit in the SA out signal is then latched by a bit latch circuit 224. The plurality of bit latch circuits 224 in the data input/output (I/O) circuitry 220 form the data latch circuit 120 (see, FIG. 3). In connection with a conventional data read mode of operation for the SRAM 112, the output of each bit latch circuit 224 is coupled (see, dotted arrows) to a data output line Q(0), . . . , Q(k–1) for a corresponding bit of the data output port.

To support the read-modify-write operation with an internal modify, each I/O circuit 222 further comprises an adder circuit 226 and a write multiplexer circuit 228. Each adder circuit 226 includes a first input (I1) that is coupled to receive the latched data bit from its corresponding bit latch circuit 224 and a second input (I2) that is coupled to a carry output of a preceding adder circuit (except for the first adder circuit associated with the least significant bit column which is coupled to a logic high voltage supply node (Vdd) for the second input). Each adder circuit 226 further includes a sum output(S) that is coupled to a first input of the write multiplexer circuit 228 and a carry output (C) that is coupled to the second input of a succeeding adder circuit (except for the last adder circuit associated with the most significant bit column which provides a saturation signal Sat for the carry output). The plurality of adder circuits 226 in the data input/output (I/O) circuitry 220 form the data modification circuit 122 (see, FIG. 3) and function to perform an increment by one operation on the data word provided by the bits latched by the bit latch circuits 224 of the data latch circuit 120. In a preferred implementation, each adder circuit 226 is a half-adder circuit whose configuration is well known to those skilled in the art. In connection with a conventional data write mode of operation for the SRAM 112, the second input of each multiplexer circuit 228 is coupled (see, dotted-dashed arrows) to a data input line D(0), . . . , D(k–1) for a corresponding bit of the data input port. The select control input for the multiplexer circuits 228 is coupled to receive a write control signal WR. When the write control signal WR is in a first logic state, the multiplexer circuits 228 pass the data from the data input lines D(0), . . . , D(k–1) for application to the corresponding bit lines BL in order to write external data into the memory core 200. Conversely, when the write control signal WR is in a second logic state, the multiplexer circuits 228 pass the data from the adder circuits 226 relating to the modified data in order to write internal data to the memory core 200.

The data input/output (I/O) circuitry 220 for the SRAM 112 further includes a data modification timing circuit 230. The data modification timing circuit 230 comprises a latching end detect circuit 232 that is coupled to the bit latch circuit 224 for the least significant bit column. The latching end detect circuit 232 operates to detect when that least significant bit latch circuit 224 has successfully completed latching of the data logic state of the least significant bit of data sensed by the sense amplifier SA circuit. In response to this detection, the latching end detect circuit 232 asserts an end signal END. The data modification timing circuit 230 further comprises a dummy adder circuit 234 corresponding to each adder circuit 226 (i.e., the circuits are copies or replicas of each other). Each dummy adder circuit 234 includes a first input coupled to receive a logic high voltage (Vdd; not explicitly shown) and a second input that is coupled to an output of a preceding dummy adder circuit (except for the first dummy adder circuit associated with the least significant bit column which is coupled to receive the end signal END). Each dummy adder circuit 234 further includes an output (specifically the carry output) that is coupled to the second input of a succeeding dummy adder circuit (except for the last dummy adder circuit associated with the most significant bit column which provides a data modification complete signal mCmplt output by the data modification timing circuit 230). Each dummy adder circuit 234 has a propagation delay from input to output which corresponds to a propagation delay from input to output of the adder circuit 226. Thus, the data modification complete signal mCmplt is asserted in response to propagation of the end signal END through the series of dummy adder circuit 234 and this corresponds to an amount of time (for example, a worst case) taken by the plurality of adder circuits 226 of the data modification circuit 122 to complete the increment by one operation.

Although the latching end detect circuit 232 is shown in FIG. 5 to be coupled to the bit latch circuit 224 for the least significant bit column, it will be understood that this is by example only. In an alternate configuration of the circuit where the most significant bit column is furthest from the row decoder circuit 210, it would be preferable for the end detection to be made with respect to latching of that bit data for the signal SA out output from the sense amplifier.

A dummy data input/output (D-I/O) circuitry 240 for the SRAM 112 includes a read detect circuit 242 that is coupled to the read dummy bit line RDBL for the dummy read cell Mr that is actuated by assertion of the dummy word line DWL. The read detect circuit 242 may include a digital logic circuit (not explicitly shown) to sense a specific lower voltage level on the read dummy bit line RDBL as a function of the logic state of the fixed data bit stored in the dummy read cell Mr, and thus this circuit operates to determine timing of completion of a read of the fixed data bit stored in the dummy read cell Mr. For example, a threshold comparison circuit of the read detect circuit 242 determines when the voltage on the read dummy bit line passes a certain threshold level. In response to that determination, dummy read is complete and the read detect circuit 242 asserts an output read detect RD signal. In addition, upon detected completion of the dummy read, the read detect circuit 242 asserts a reset signal (Rst) that is used in controlling the selective modulation of the word line during the modify step 2 operation.

The dummy data input/output (D-I/O) circuitry 240 for the SRAM 112 further includes a write driver and write detect (dummy write) circuit 244 that is coupled to the write dummy bit line WDBL for the dummy write cell Mw that is actuated by assertion of the dummy word line DWL. The write driver functionality of the dummy write circuit 244 is actuated in response to a write start WS signal and operates to write a certain logic state into the dummy write cell Mw. The write detect functionality of the dummy write circuit 244 receives the write complete signal (wCmplt) which is asserted by the dummy write cell Mw in response to successful completion of the data write. In response to receipt of the write complete signal (wCmplt), the dummy write circuit 244 asserts the reset signal (Rst).

A control circuit (CTRL) 250 for the SRAM 112 includes a clock generator circuit 252. The clock generator circuit 252 receives the external clock signal CLK, a set signal (Set) and the reset signal (Rst), and generates the internal clock signal CLKint. The pulses of the clock signal CLKint are controlled to have a leading edge in response to the external clock signal CLK or the set signal and have a trailing edge in response to the reset signal.

A write start circuit 254 of the control circuit 250 receives the data modification complete signal mCmplt from the last dummy adder circuit 234 of the data modification timing circuit 230 and the saturation signal Sat from the last adder circuit 226 of the data modification circuit 122. The write start circuit 254 asserts the write start WS signal in response to the data modification complete signal mCmplt. Additionally, the write start circuit 254 asserts the set signal (Set) in response to the data modification complete signal mCmplt, where that set signal is used in controlling the selective modulation of the word line during the modify step 2 operation. The dummy write operation performed by the write driver and write detect circuit 144 occurs only after the data modification timing circuit 230 indicates through assertion of the data modification complete signal mCmplt that the data modify operation being performed by the data modification circuit 122 has been completed. The write start circuit 254 further asserts a block signal Blk in response to the saturation signal Sat. The block signal Blk is asserted in the situation where the data modify operation being performed by the data modification circuit 122 results in an overflow. For example, consider the situation where the read count value from the memory is at a maximum value such as <1,1,1, . . . , 1,1,1>. In this case, the increment by one operation being performed by the data modification circuit 122 will produce an output value of <0,0,0, . . . , 0,0,0> with the carry of one from the addition operation being indicated by the assertion of the saturation signal Sat. In this scenario, it would be undesirable for the write operation to be performed as this would cause a loss of the histogram data for that bin of the memory by essentially resetting the count value to zero. The assertion of the block signal Blk is used to control a blocking of the performance of the write operation from occurring. Conversely, the block signal Blk is deasserted, in the absence of the saturation signal Sat, in response to the data modification complete signal mCmplt.

The control circuit 250 further includes a multiplexer controller 258 that receives the internal clock signal CLKint and the block signal Blk. The multiplexer controller 258 generates the write control signal WR which is applied to the select control input for the multiplexer circuits 228. The write control signal WR is asserted in the second logic state only if the internal clock signal CLKint is asserted and the block signal Blk is deasserted. In that case, the multiplexer circuits 228 respond to the second logic state of the write control signal WR by passing the data from the adder circuits 226 in order to write internal data to the memory core 200. If the block signal Blk is asserted, indicating that the result of the increment by one operation being performed by the data modification circuit 122 is a saturation (i.e., overflow), the write control signal WR is deasserted to the first logic state and the writing of the data from the adder circuits 226 to the memory is blocked.

A sense amplifier enable circuit 256 of the control circuit 250 receives the read detect RD signal output by the read detect circuit 242. In response thereto, the sense amplifier enable circuit 256 asserts the sense amplifier enable SAEN signal. Thus, the sense amplifier SA circuits are enabled for operation only after the read detect circuit 242 has determined that a read of the data bit stored in the dummy read cell Mr has been completed.

Figure 7:
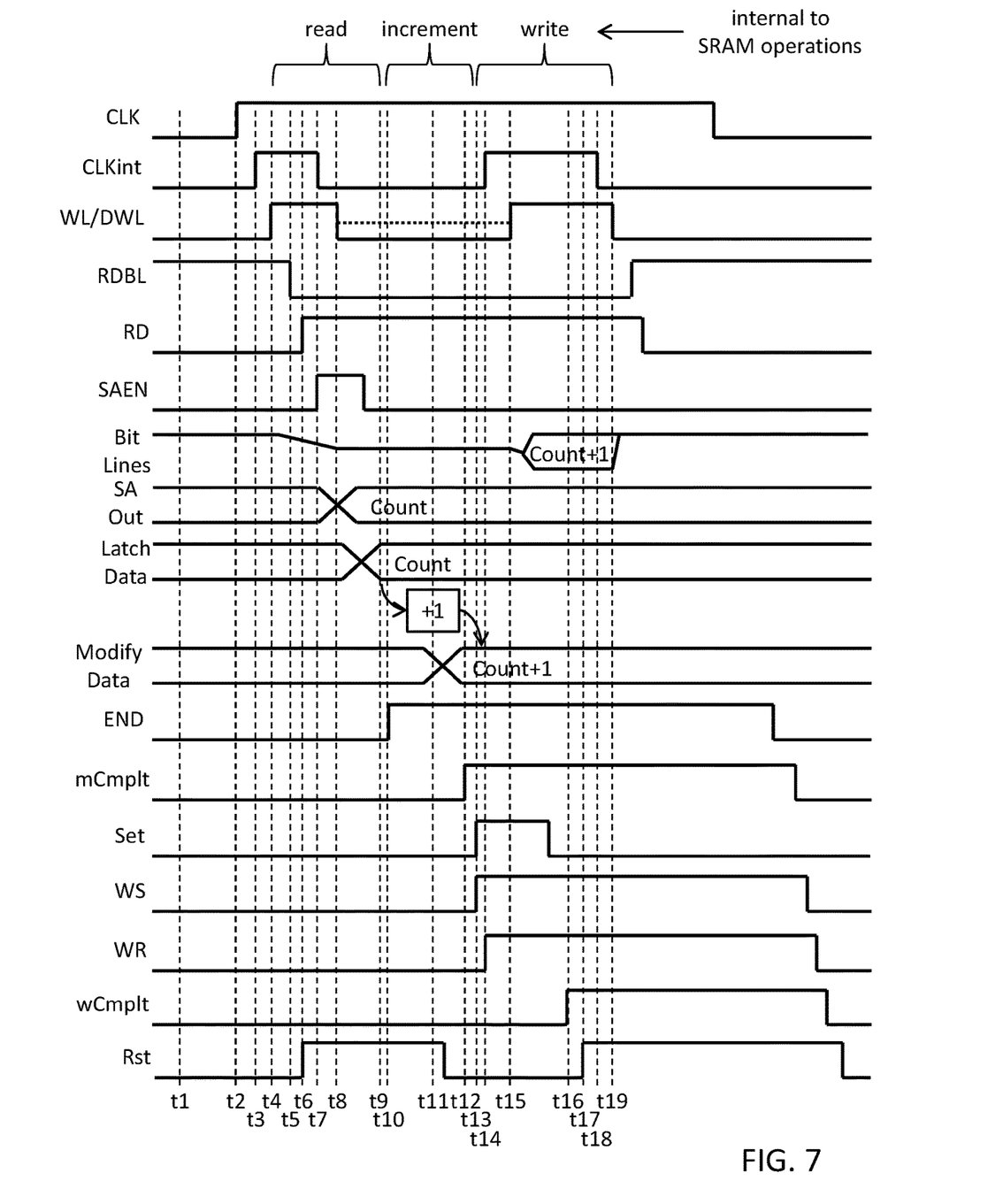
FIG. 7 shows a timing diagram for operation of the circuit of FIG. 6.

Reference is now made to FIG. 7 which shows a timing diagram for operation of the circuit SRAM 112 of FIG. 6. At time t1, the SRAM 112 is enabled for operation and the bit lines 116 are precharged to a precharge voltage level (shown here, by example only, at Vdd). At time t2, the memory address (Address) is applied and the clock signal CLK pulses. In response to the leading edge of the clock signal CLK pulse, the clock generator circuit 252 generates the leading edge of the internal clock signal CLKint at time t3. The Address is decoded by the row decoder 210 and the word line (WL) coupled to the data word location (dw loc) corresponding to the decoded Address is asserted logic high at time t4. At the same time, the row decoder 210 also asserts the dummy word line (DWL) logic high. Discharge of the bit lines begins. The dummy read cell Mr is accessed by the asserted dummy word line (DWL) and the logic state of the read dummy bit line RDBL falls at time t5 to a logic low level matching the fixed logic state programmed in the dummy read cell Mr. The read detect circuit 242 of the dummy input/output (D-I/O) circuit 240 detects completion of the dummy read operation and asserts the read detect RD signal at time t6. The read detect circuit 242 further asserts the reset signal (Rst). The sense amplifier enable circuit 256 of the control circuit 250 responds to the asserted read detect RD signal by asserting the sense amplifier enable SAEN signal to enable the sense amplifier SA circuits at time t7. In response to the asserted reset signal, the clock generator 252 deasserts the internal clock CLKint at time t7 and the word line is then deasserted at time t8 in accordance with the word line modulation scheme of FIG. 5A (alternately, in accordance with the word line modulation scheme of FIG. 5B, the word line underdrive voltage is applied at time t8 as shown by the dotted line voltage level). Discharge of the bit lines then terminates in the FIG. 5A implementation or has a reduced slope in the FIG. 5B implementation. The sense amplifier circuits respond at time t8 to drive the sense amplifier output signals SA out to logic high or logic low levels dependent on the logic state of the bits of the data word stored in the accessed data word location and presented on the bit lines. Thus, the data word has been read (step 1) from the memory array 114 and the logic states of the sense amplifier output signals SA out now reflect the count value (Count). The read data bits of the data word from the amplifier output signals SA out are then latched at time t9 by the bit latches 224, and thus the latched data also reflects the count value (Count). The end detect circuit 232 detects that the bit latch 224 of the least significant bit column has successfully latched the bit data from the bit lines and asserts the end detect END signal at time t10. The data modification circuit 122 then performs the mathematical modify operation (step 2) at time t11, which in this example case is an increment by one (+1) operation, and the output modified data from the adder circuits 226 reflects the incremented count value (Count+1) at time t12. The dummy adder circuits 234 of the data modification timing circuit 230 perform a parallel mathematical modify operation and the data modification complete signal mCmplt is asserted at time t12 in response to completion of the parallel operation. The write start circuit 254 then asserts the write start WS signal and the set signal (Set) at time t13 in response to the data modification complete signal mCmplt. The block signal Blk is also not asserted at this time by the write start circuit 254 (assuming here that there is no saturation due to the increment operation), and so the multiplexer control circuit 258 will then assert the write control signal WR in the second logic state at time t14. In response to assertion of the set signal, clock generator 252 will assert the internal clock signal CLKint at time t14 which causes the word line to again be asserted logic high at time t15 in accordance with the word line modulation scheme of FIG. 5A (alternately, in accordance with the word line modulation scheme of FIG. 5B, the word line underdrive voltage is terminated and full Vdd voltage is applied at time t15). Discharge of the bit lines then resumes. The data bits of the modified data word are then applied to the bit lines 116 through the multiplexer circuits 228 and the modified data word is then written (step 3) for storage at the accessed data word location in the memory array 114. In the meantime, the write driver and write detect (dummy write) circuit 244 responds to assertion of the write start WS signal by performing a data write to the dummy write cell Mw. The dummy write cell Mw responds to completion of the data write by asserting the write complete signal wCmplt at time t16. The dummy write circuit 244 then responds to receipt of the write complete signal wCmplt by asserting the reset signal Rst at time t17. The clock generator circuit 252 then deasserts the internal clock signal CLKint at time t18, and the word lines (WL and DWL) are then deasserted at time t19.

It will be noted that in the situation where there is a saturation due to the increment operation, the block signal Blk will be asserted at time t13 by the write start circuit 254 and the multiplexer control circuit 258 will accordingly deassert the write control signal WR in the first logic state at time t14. This blocks the multiplexer circuits 228 from applying the data bits of the modified data word to the bit lines 116, so as to preserve the previous count value for the histogram.

Figure 8:
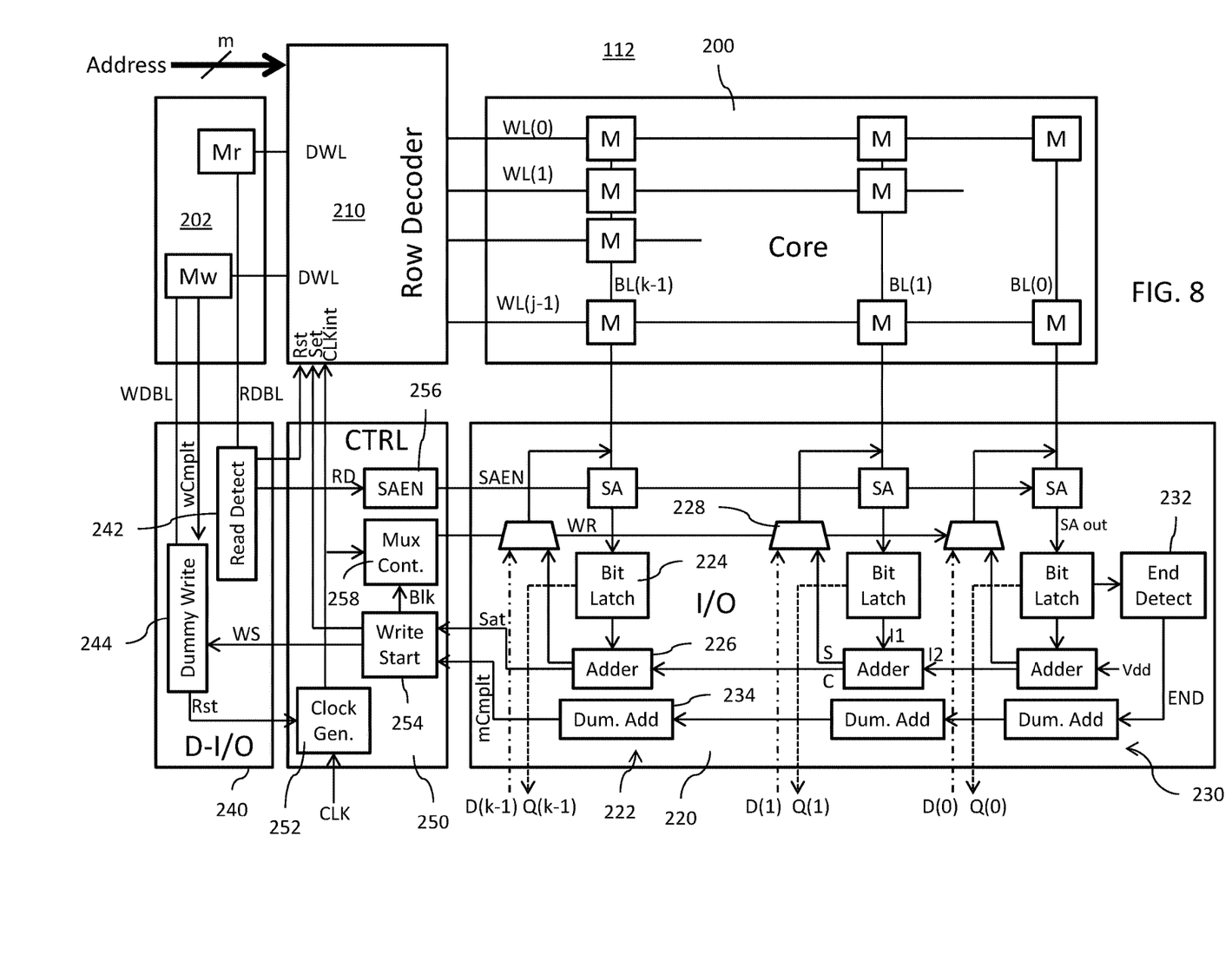
FIG. 8 shows a detailed block diagram of an alternative embodiment for the SRAM for the circuit of FIG. 3.

FIG. 8 shows a detailed block diagram for an alternative embodiment of the SRAM 112 for the circuit 110 of FIG. 3. Like references in FIGS. 6 and 8 refer to same or similar components as described in detail above. The embodiment of FIG. 8 differs from the embodiment of FIG. 6 in the control signaling and circuit for implementation of the word line modulation scheme. Operation of the FIG. 8 embodiment follows the timing diagram of FIG. 7.

As previously discussed, the dummy data input/output (D-I/O) circuitry 240 for the SRAM 112 includes a read detect circuit 242 that is coupled to the read dummy bit line RDBL for the dummy read cell Mr that is actuated by assertion of the dummy word line DWL. The read detect circuit 242 senses a specific lower voltage level on the read dummy bit line RDBL to detect completion of a read of the fixed data bit stored in the dummy read cell Mr. In response to that determination, the dummy read is complete and the read detect circuit 242 asserts an output read detect RD signal which is used to control actuation of the sense amplifier enable circuit/signal to turn on the sense amplifiers. In this FIG. 8 embodiment, the read detect circuit 242 asserts, upon detected completion of the dummy read, a reset signal (Rst) that is applied to the row decoder circuit 210. In response to assertion of the reset signal, the row decoder circuit 210 deasserts the word line (see FIG. 7, time t8) in accordance with the word line modulation scheme of FIG. 5A (alternately, in accordance with the word line modulation scheme of FIG. 5B, the row decoder circuit controls application of the word line underdrive voltage (see, FIG. 7, time t8, dotted line voltage level)).

Additionally, the write start circuit 254 of the control circuit 250 asserts the write start WS signal and the set signal (Set) in response to the data modification complete signal mCmplt. The Mux control circuit 258 responds to assertion of the write start WS signal to control selection by the multiplexers 228 of the bits of the incremented count value for write back into the memory. The asserted set signal is applied to the row decoder circuit 210. In response to assertion of the set signal, the row decoder circuit 210 asserts the word line logic high (see FIG. 7, time t15) in accordance with the word line modulation scheme of FIG. 5A (alternately, in accordance with the word line modulation scheme of FIG. 5B, the row decoder circuit word line terminates application of the underdrive voltage and full Vdd voltage is applied (see, FIG. 7, time t15)).

Figure 9:
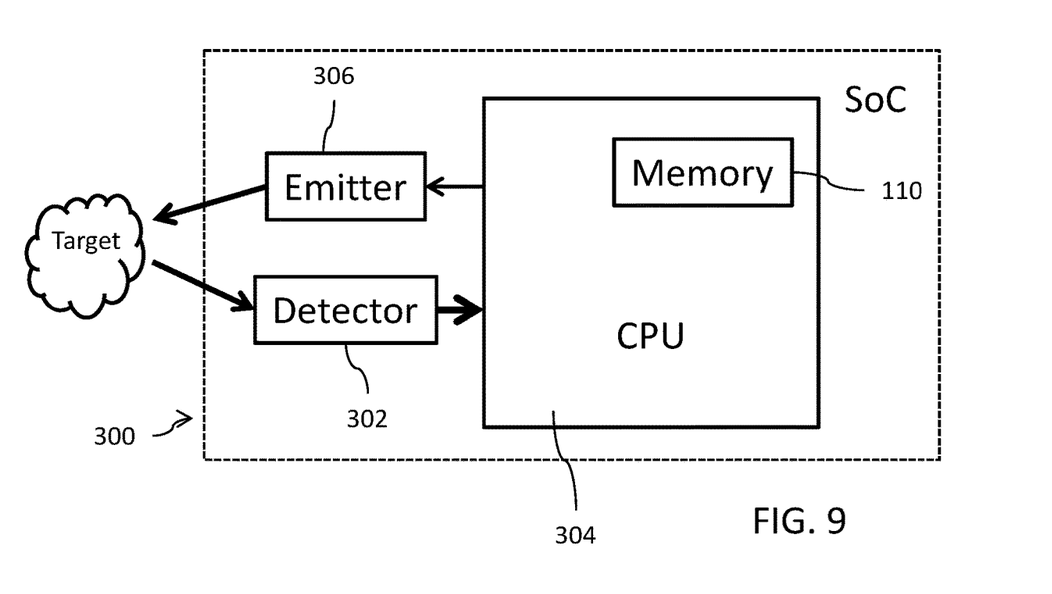
FIG. 9 is a schematic representation of a device, for example in form of an image sensor, which utilizes the circuit of FIG. 3, 6 or 8.

Reference is now made to FIG. 9 which shows a schematic representation of a device 300 which utilizes the circuit 110 of FIG. 3, 6 or 8. The device 300 may, for example, comprise an image sensor in the form of a System on Chip (SoC) that includes a photosensitive circuit 302 having output that is processed by a central processing unit 304. The circuit 110 may, for example, comprise a memory which is coupled to or embedded in the central processing unit 304. In a particularly pertinent example, the image sensor may comprise a time of flight (ToF) sensor as is well known in the art. Such a sensor includes an emitter circuit 306 configured to emit light pulses which are reflected by a target back towards the photosensitive circuit 302. In response to detections of the reflected light pulses, the circuit 110 is accessed by the CPU 304 at memory addresses associated with timing measurements. Each access causes a mathematical modification (for example, increment by one) of a stored count value which over time provides histogram data useful in identifying targets and the distances to those targets.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit that is clocked by a clock signal, comprising:
   a memory array including memory cells forming a data word location accessed in response to a modulated word line signal;
   a plurality of bit lines associated with said memory cells;
   a data sensing circuit configured when the modulated word line signal has a first voltage level to sense data on said plurality of bit lines, said sensed data corresponding to a current data word stored at the data word location;
   a data latching circuit configured to latch the sensed data for said current data word from the data sensing circuit;
   a data modification circuit configured when the modulated word line signal has a second voltage level lower than the first voltage level to perform an internal memory mathematical modify operation on the current data word to generate a modified data word; and
   a data writing circuit configured when the modulated word line signal has the first voltage level to apply data for the modified data word to the plurality of bit lines for writing back to the memory cells of the memory array at said data word location;
   wherein the sensing of the data on said plurality of bit lines, the latching of the sensed data, the performing of the internal memory mathematical modify operation and the writing back of the modified data word all occur within a single cycle of the clock signal.

2. The circuit of claim 1, wherein the first voltage level is a logic high voltage level and the second voltage level is a logic low voltage level.

3. The circuit of claim 1, wherein the first voltage level is a logic high voltage level and the second voltage level is a word line underdrive voltage level.

4. The circuit of claim 1, further comprising a decoder circuit configured to decode a memory address identifying said data word location and generate the word line signal having the first voltage level during sensing of the data on said plurality of bit lines, having the second voltage level during performance of the internal memory mathematical modify operation, and having the first voltage level during writing back of the modified data word.

5. The circuit of claim 4, further comprising:
   a read timing circuit configured to perform a dummy read operation from a dummy read memory cell when the word line signal has the first voltage level, said read timing circuit generating a reset signal configured to cause a switch of the word line signal from the first voltage level to the second voltage level; and
   a modify timing circuit configured to perform a dummy mathematical modify operation when the word line signal has the second voltage level, said modify timing circuit generating a set signal configured to cause a switch of the word line signal from the second voltage level to the first voltage level.

6. The circuit of claim 5, further comprising: a write timing circuit configured to perform a dummy write operation to a dummy write memory cell when the word line signal has the first voltage level, said write timing circuit generating a further reset signal configured to cause deassertion of word line signal generation in response to completion of said dummy write operation.

7. The circuit of claim 1, wherein the internal memory mathematical modify operation is an increment by one operation.

8. The circuit of claim 1, wherein said data word location forms a bin for storing a histogram data word.

9. The circuit of claim 1, further comprising a read timing circuit configured to control timing for changing the word line signal from the first voltage level to the second voltage level in response to completion of a dummy read operation from a dummy memory cell.

10. The circuit of claim 1, further comprising a data modification timing circuit configured to control timing for changing the word line signal from the second voltage level to the first voltage level in response to completion of a dummy mathematical modify operation.

11. The circuit of claim 1, wherein the circuit comprises a data memory and wherein the memory array, the plurality of bit lines, the data sensing circuit, the data latching circuit, the data modification circuit and the data writing circuit are all component parts of the data memory which is clocked by said clock signal.

12. The circuit of claim 1, wherein said circuit is a component of an image sensing circuit.

13. A method for performing a read-modify-write operation, comprising:
   for a single cycle of a clock signal:
      decoding an address to select a word line of a memory;
      applying a word line signal at a first voltage level to the selected word line;
      reading a current data word from a data word location in the memory;
      after reading, reducing the word line signal from the first voltage level to a second voltage level;
      performing a mathematical modify operation internally within the memory on the current data word to generate a modified data word;
      after performing, increasing the word line signal from the second voltage level to the first voltage level; and
      then writing the modified data word back to the data word location in the memory.

14. The method of claim 13, wherein the first voltage level is a logic high voltage level and the second voltage level is a logic low voltage level.

15. The method of claim 13, wherein the first voltage level is a logic high voltage level and the second voltage level is a word line underdrive voltage level.

16. The method of claim 13, further comprising:
   performing a dummy read operation from a dummy read memory cell when the word line signal has the first voltage level;
   wherein reducing the word line signal from the first voltage level to the second voltage level is performed in response to completion of the dummy read operation; and
   performing a dummy mathematical modify operation when the word line signal has the second voltage level;
   wherein increasing the word line signal from the second voltage level to the first voltage level is performed in response to completion of the dummy mathematical modify operation.

17. The method of claim 16, further comprising:
   performing a dummy write operation to a dummy write memory cell when the word line signal has the first voltage level; and
   deasserting the word line signal in response to completion of the dummy write operation.

18. The method of claim 13, wherein the mathematical modify operation is an increment by one operation.

19. The method of claim 13, wherein said data word location forms a bin for storing a histogram data word.

20. The method of claim 13, further comprising controlling timing for changing the word line signal from the first voltage level to the second voltage level in response to completion of a dummy read operation from a dummy memory cell.

21. The method of claim 13, further comprising controlling timing for changing the word line signal from the second voltage level to the first voltage level in response to completion of a dummy mathematical modify operation.

* * * * *